(12) United States Patent
Niimi et al.

(10) Patent No.: US 12,400,963 B2
(45) Date of Patent: Aug. 26, 2025

(54) CONDUCTIVE SUPERLATTICE STRUCTURES AND METHODS OF FORMING THE SAME

(71) Applicant: Tokyo Electron Limited, Tokyo (JP)

(72) Inventors: Hiroaki Niimi, Albany, NY (US); Gerrit Leusink, Albany, NY (US); Hiroki Maehara, Miyagi (JP); Einstein Noel Abarra, Tokyo (JP); Naoki Watanabe, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 466 days.

(21) Appl. No.: 17/884,371

(22) Filed: Aug. 9, 2022

(65) Prior Publication Data

US 2023/0051311 A1    Feb. 16, 2023

Related U.S. Application Data

(60) Provisional application No. 63/233,683, filed on Aug. 16, 2021.

(51) Int. Cl.
*H01L 21/768* (2006.01)
*H01L 23/522* (2006.01)
*H01L 23/532* (2006.01)

(52) U.S. Cl.
CPC .... *H01L 23/53266* (2013.01); *H01L 21/7682* (2013.01); *H01L 21/76885* (2013.01); *H01L 23/5226* (2013.01)

(58) Field of Classification Search
CPC ............ H01L 23/53266; H01L 23/532; H01L 23/5226; H01L 23/522; H01L 21/7682; H01L 21/768; H01L 21/76885; H01L 21/2855; H10F 99/00; H10D 30/62; H10D 30/4732; H10D 30/015; H10D 30/6211; H10D 30/024
See application file for complete search history.

(56) References Cited

U.S. PATENT DOCUMENTS

| 9,755,140 | B2 | 9/2017 | Lim et al. |
| 11,251,367 | B2 * | 2/2022 | Guo .................. H10N 50/80 |
| 2014/0037989 | A1 | 2/2014 | Kunliang et al. |
| 2019/0088857 | A1 | 3/2019 | Park et al. |
| 2019/0304521 | A1 | 10/2019 | Tahmasebi et al. |

(Continued)

FOREIGN PATENT DOCUMENTS

KR    20160039798 A    4/2016

OTHER PUBLICATIONS

Ye et al., "Ru Nanoframes with an fcc Structure and Enhanced Catalytic Properties", 2016, Nano Letters, vol. 16, Issue 4, pp. 2812-2817, Mar. 21, 2016 (Year: 2016).*

(Continued)

*Primary Examiner* — Nikolay K Yushin
(74) *Attorney, Agent, or Firm* — Slater Matsil, LLP

(57) ABSTRACT

A method of forming a metal superlattice structure includes depositing, on a substrate, a layer of a first metal with face-centered-cubic (fcc) crystal structure. The method further includes depositing a layer of ruthenium (Ru) metal with fcc crystal structure on the layer of the first metal. The layer of the first metal may cause the layer of ruthenium metal to have fcc crystal structure.

20 Claims, 15 Drawing Sheets

(56) References Cited

U.S. PATENT DOCUMENTS

2021/0249469 A1    8/2021  Xiao
2021/0273157 A1*   9/2021  Guo ...................... H10N 50/80

OTHER PUBLICATIONS

International Search Report and Written Opinion; Application No. PCT/US2022/038176 dated Nov. 16, 2022, 9 pages.
Murdoch, G. et al., "Semidamascene Interconnects for 2nm node and Beyond," 2020 IEEE International Interconnect Technology Conference (IITC), San Jose, California, Oct. 5-9, 2020, 3 pages.
Philip, T. et al., "First principles evaluation of fcc ruthenium for use in advanced interconnects," Phys. Rev. Applied, vol. 13, Issue 4, American Physical Society, Mar. 4, 2020, 9 pages.

* cited by examiner

CONDUCTIVE SUPERLATTICE STRUCTURES AND METHODS OF FORMING THE SAME

CROSS-REFERENCE TO RELATED APPLICATIONS

This application claims the benefit of U.S. Provisional Application No. 63/233,683, filed on Aug. 16, 2021, which application is hereby incorporated herein by reference.

TECHNICAL FIELD

The present invention relates generally to semiconductor manufacturing, and, in particular embodiments, to methods for forming conductive superlattice structures and devices comprising such conductive superlattice structures.

BACKGROUND

As the semiconductor industry turns to alternative conductors to replace copper (Cu) metal for future interconnect nodes with improved device performance, much attention has been focused on evaluating the electrical performance of possible alternative metals or metal alloys. The crystal structure of a metal or a metal alloy is one of the most dominant factors that strongly affect the properties of an alloy, such as because the electronic structure changes drastically with the crystal structure. For ruthenium (Ru) metal, the most thermodynamically preferred crystal structure is hexagonal-closed-packed (hcp). However, relatively little attention has been paid to the face-centered-cubic (fcc) phase, which has been shown to nucleate in confined structures and may be present in tight-pitch interconnects.

SUMMARY

In accordance with an embodiment, a method of forming a metal superlattice structure includes: depositing, on a substrate, a layer of a first metal with face-centered-cubic (fcc) crystal structure; and depositing a layer of ruthenium (Ru) metal with fcc crystal structure on the layer of the first metal.

In accordance with another embodiment, a method of forming a metal superlattice structure includes: depositing, on a substrate including an active device, a first layer of a first metal with face-centered-cubic (fcc) crystal structure, the first layer being electrically coupled with the active device; depositing a first layer of ruthenium (Ru) metal on the first layer of the first metal, wherein the first layer of the first metal causes the first layer of Ru metal to have fcc crystal structure; depositing, on the first layer of Ru metal, a second layer of the first metal with fcc crystal structure; and depositing a second layer of Ru metal on the second layer of the first metal, wherein the second layer of the first metal causes the second layer of Ru metal to have fcc crystal structure.

In accordance with yet another embodiment, a metal superlattice structure includes: a layer of a first metal with face-centered-cubic (fcc) crystal structure; and a layer of ruthenium (Ru) metal with fcc crystal structure on the layer of the first metal.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
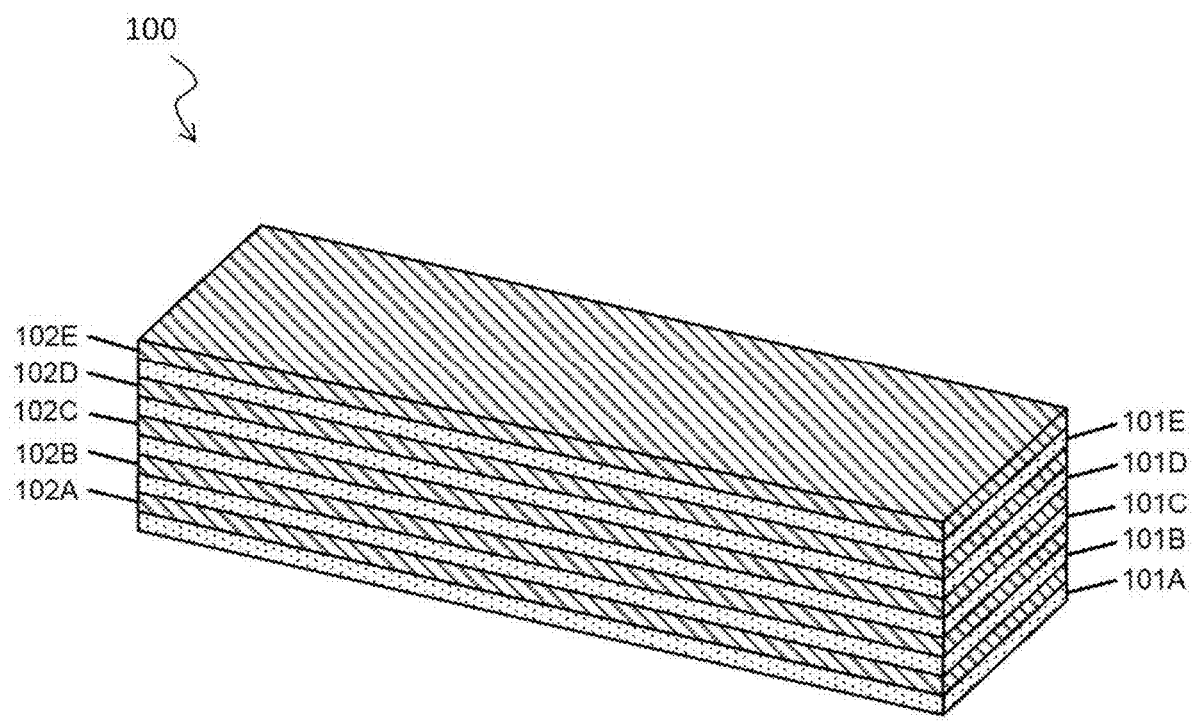
FIG. 1 illustrates a cross-sectional view of a superlattice structure, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments. The references used herein are provided merely for convenience and hence do not define the extent of protection or the scope of the embodiments.

According to one or more embodiments of the present disclosure, this application relates to low electrical resistivity metal superlattice structures containing ruthenium metal and other low electrical resistivity transition metals and methods of forming the same. Superlattice structures containing ruthenium metal are attractive for use as interconnects in back-end-of-line (BEOL) applications and other advanced applications, such as for reasons of low electrical resistivity and small electron mean-free-path. Phonon-limited bulk resistivity of face-centered-cubic (fcc) ruthenium metal is less than about half that of the thermodynamically preferred hexagonal-closed-packed (hcp) ruthenium metal. This lower resistivity of the fcc ruthenium metal may be used to form superlattice structures including layers of ruthenium alternating other transition metals that have low electrical resistivity and fcc crystal structures. Further, these superlattice structures may be reasonably integrated with other materials due to favorable materials properties including a high melting point and formation of a smooth interface with other materials. In some examples, these superlattice structures may be integrated with dielectric materials. Diffusion barriers or liners may be added at the interfaces between the superlattice structures and the dielectric materials.

According to some embodiments, a method is described for forming a low electrical resistivity metal superlattice structure. The method includes depositing a layer of a first metal with face-centered-cubic (fcc) crystal structure on a substrate and depositing a layer of ruthenium (Ru) metal with fcc crystal structure on the layer of the first metal. In some embodiments, the face-centered-cubic (fcc) crystal structure of the layer of the first metal causes the layer of the ruthenium metal to have at least substantially fcc crystal structure.

Embodiments of the disclosure are described in the context of the accompanying drawings. An embodiment of a conductive superlattice structure and methods of forming the same will be described using FIG. 1. An embodiment of a process chamber and methods of using the same for deposition processes will be described using FIG. 2. An embodiment of manufacturing a semiconductor structure including a conductive superlattice structure will be described using FIGS. 3 through 9. Another embodiment of manufacturing a semiconductor structure including a conductive superlattice structure will be described using FIGS. 10 through 13. Embodiments of methods for forming superlattice structures will be described using FIGS. 14 and 15.

FIG. 1 illustrates a conductive superlattice structure 100, in accordance with some embodiments. The conductive superlattice structure 100 includes alternating layers of ruthenium metal with fcc crystal structure and layers of a first metal with fcc crystal structure. In the example of FIG. 1, five layers of ruthenium metal 102A, 102B, 102C, 102D, and 102E and five layers of the first metal 101A, 101B, 101C, 101D, and 101E are illustrated. However, any suitable number of alternating layers of ruthenium metal and the first metal may be formed and are within the scope of the disclosed embodiments. Thus, other conductive superlattice structures can contain one, two, three, or more alternating layers of ruthenium metal and the first metal. In one embodiment, as depicted in FIG. 1, a surface of each layer of ruthenium metal is in direct physical contact with a surface of a layer of the first metal.

According to some embodiments, a method of forming the conductive superlattice structure 100 includes forming, on a substrate (not illustrated), a layer 101A of a first metal with fcc crystal structure, and forming a layer 102A of ruthenium metal with fcc crystal structure on the layer 101A of the first metal. The method further includes depositing, on the layer 102A of the ruthenium metal, a second layer 101B of the first metal with fcc crystal structure, and depositing a second layer 102B of ruthenium metal with fcc crystal structure on the second layer of the first metal. The alternating layers of the first metal and the ruthenium metal form a periodic conductive superlattice structure 100 that has lower electrical resistivity than a layer of hcp ruthenium metal with a same thickness as the conductive superlattice structure.

According to some embodiments, a respective thickness of each layer of the ruthenium metal layers 102A, 102B, 102C, 102D, and 102E is less than or equal to the c lattice parameter (c=0.428 nm) of a hexagonal-closed-packed (hcp) ruthenium metal crystal structure. This thickness of each layer of ruthenium metal layer restricts formation of the thermodynamically preferred hcp ruthenium metal structure. As such, each layer of the ruthenium metal layers 102A, 102B, 102C, 102D, and 102E has a fcc crystal structure.

According to some embodiments, the composition of the first metal of the layers of the first metal 101A, 101B, 101C, 101D, and 101E includes rhodium (Rh) metal, iridium (Ir) metal, palladium (Pd) metal, the like, or a combination thereof. For example, the first metal may include a mixture of palladium (Pd) metal and copper (Cu) metal.

In one example, a layer 101A of the first metal is deposited over a substrate (not illustrated) by physical vapor deposition (PVD) at a substrate temperature of about 200 Kelvin or less, and a layer 102A of ruthenium metal is then deposited by physical vapor deposition at a substrate temperature of about 200 Kelvin or less. In one example, the substrate temperature is about 100 Kelvin. The physical vapor deposition may include alternatingly sputtering the first metal from a first target and sputtering the ruthenium metal from a second target. In one example, the physical vapor deposition is performed at a gas pressure of about 1 mTorr or less. According to some embodiments, a superlattice structure of one layer of fcc ruthenium metal (e.g., the layer 102A) on one layer of fcc first metal (e.g., the layer 101A) has lower electrical resistivity than a layer of hcp ruthenium metal with a same thickness as the superlattice structure.

Figure 2:
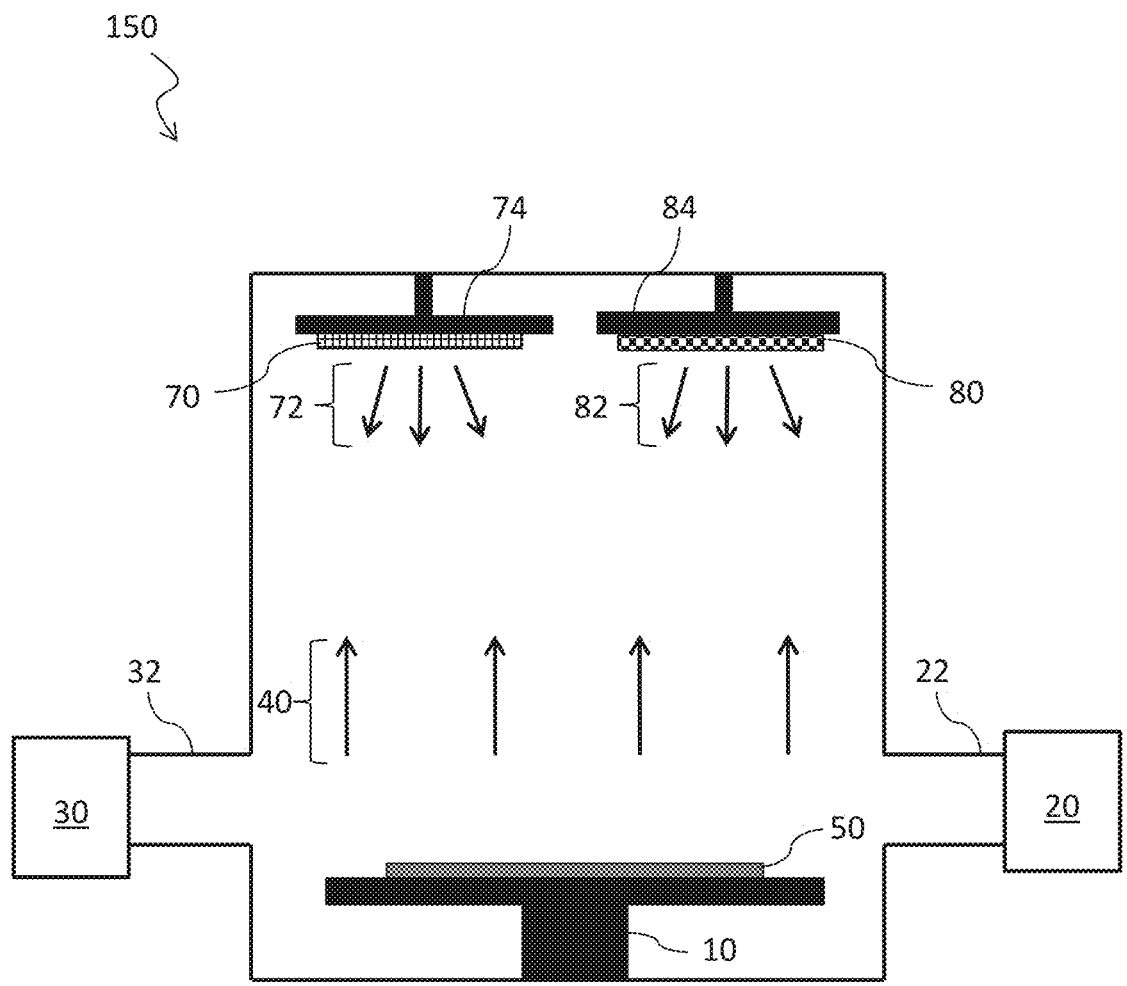
FIG. 2 illustrates a cross-sectional view of a process chamber, in accordance with some embodiments.

FIG. 2 illustrates a cross-sectional view of an example process chamber 150 for performing a deposition of a conductive superlattice structure 100 (see above, FIG. 1) over a substrate 50, in accordance with some embodiments. The process chamber 150 may be configured for physical vapor deposition (PVD), although any suitable deposition method (e.g., ALD, PEALD, MBE (Molecular-beam epitaxy), or the like) may be used. The process chamber 150 includes a chuck 10 for holding a substrate 50. The chuck 10 is configured to hold a substrate 50 (e.g., a semiconductor wafer that may have front end of the line (FEOL) structures including active devices formed on a top surface) inside the process chamber 150 to process a major surface of the substrate 50. For example, the chuck 10 may be an electrostatic chuck including a bottom electrode or anode (not illustrated). In some embodiments, the chuck 10 is configured to rotate the substrate 50 during a deposition process, which may increase uniformity of deposition.

The process chamber 150 is coupled to a vacuum pump 20 through an outlet 22. The vacuum pump 20 is used to evacuate the process chamber 150 to a sufficiently low pressure for performing PVD, e.g. a pressure less than 1 mTorr. In some embodiments, the process chamber pressure depends on the flow rate of the sputtering gas and is around, e.g., 0.5 mTorr. The vacuum pump 20 may be any suitable vacuum pump, e.g. a turbomolecular pump.

A gas source 30 (e.g., a gas cylinder) is coupled to the process chamber 150 through an inlet 32. The gas source 30 provides a sputtering gas to the process chamber 150. The sputtering gas may be an inert gas such as argon, neon, krypton, xenon, carbon dioxide, the like, or a combination thereof. However, any suitable sputtering gas may be provided to the process chamber 150.

Two or more targets, such as target 70 and target 80, are mounted on respective top cathodes 74 and 84 of the process chamber 150. The target 70 and the target 80 are sources of the material to be deposited by physical vapor deposition over the substrate 50. For example, in some embodiments, the target 70 is a sheet of the first metal (see above, FIG. 1) such as rhodium (Rh) metal, iridium (Ir) metal, palladium (Pd) metal, a mixture of palladium (Pd) metal and copper (Cu) metal, the like, or a combination thereof, and the target 80 is a sheet of ruthenium (Ru) metal. Although one target 70 of a first metal and one target 80 of ruthenium metal are illustrated in FIG. 2, any suitable number of targets may be present and mounted on respective cathodes.

The substrate 50 is transported to the process chamber 150 and mounted on the chuck 10. In some embodiments, the substrate 50 is cooled to a temperature below 200 K, such as 100 K, prior to being installed in the process chamber 150. In some embodiments, the process chamber 150 is operated at a process temperature below 200 K, such as 100 K, during deposition processes.

Once the substrate 50 is installed and the process chamber 150 is brought to a suitable pressure (e.g., less than 1 mTorr, such as around 0.5 mTorr) and a suitable cryogenic temperature (e.g., less than 200 K, such as in a range of 100 K to 130 K), the sputtering gas is flowed from the gas source 30 through the inlet 32 into the processing chamber 150. In some embodiments, the sputtering gas is flowed at a rate in a range of 10 sccm to 100 sccm. The sputtering gas is excited to a plasma state to produce ions 40 (e.g., $Ar^+$ ions). The ions 40 of the sputtering gas may be directed to bombard the target 70 or the target 80 by applying an electric field between the top cathodes 74 and 84 and the bottom electrode of the chuck 10. In some embodiments, the electric field is generated with a DC power (as measured at the power source) in a range of 0.5 KW to 2 KW.

The ions 40 bombard the target 70 and the target 80, ejecting atoms 72 of the first metal from the target 70 and atoms 82 of ruthenium metal from the target 80. The atoms 72 are deposited in a single fcc layer 101A (see below, FIG. 3) of the first metal over the substrate 50, and the atoms 82 of ruthenium metal are deposited in a single fcc layer 102A (see below, FIG. 3) over the layer 101A of the first metal. In some embodiments, alternating layers of the first metal 101A, 101B, 101C, 101D, and 101E and layers of ruthenium metal 102A, 102B, 102C, 102D, and 102E are formed by alternatively bombarding the target 70 and the target 80. For example, while depositing the layer 101A, the top cathode 74 may be activated and the top cathode 84 may be deactivated, resulting in the target 70 being bombarded and atoms 72 of the first metal being ejected while the target 80 is not bombarded. Likewise, while depositing the layer 102A, the top cathode 84 may be activated and the top cathode 74 may be deactivated, resulting in the target 80 being bombarded and atoms 82 of ruthenium metal being ejected while the target 70 is not bombarded. The deposition of each layer may be performed for a duration in a range of 5 seconds to 30 seconds, which may occur over one rotation of the substrate 50 by the chuck 10.

In some embodiments, the target 70 and the target 80 are bombarded at the same time during deposition while the chuck 10 rotates the substrate 50 once to form a monolayer including atoms 72 of the first metal from the target 70 and atoms 82 of ruthenium metal from the target 80. In some embodiments, a single layer 101A of the first metal is deposited with an fcc structure by bombarding the target 70 prior to forming a subsequent layer or layers by bombarding the target 70 and the target 80 at the same time.

Figure 3:
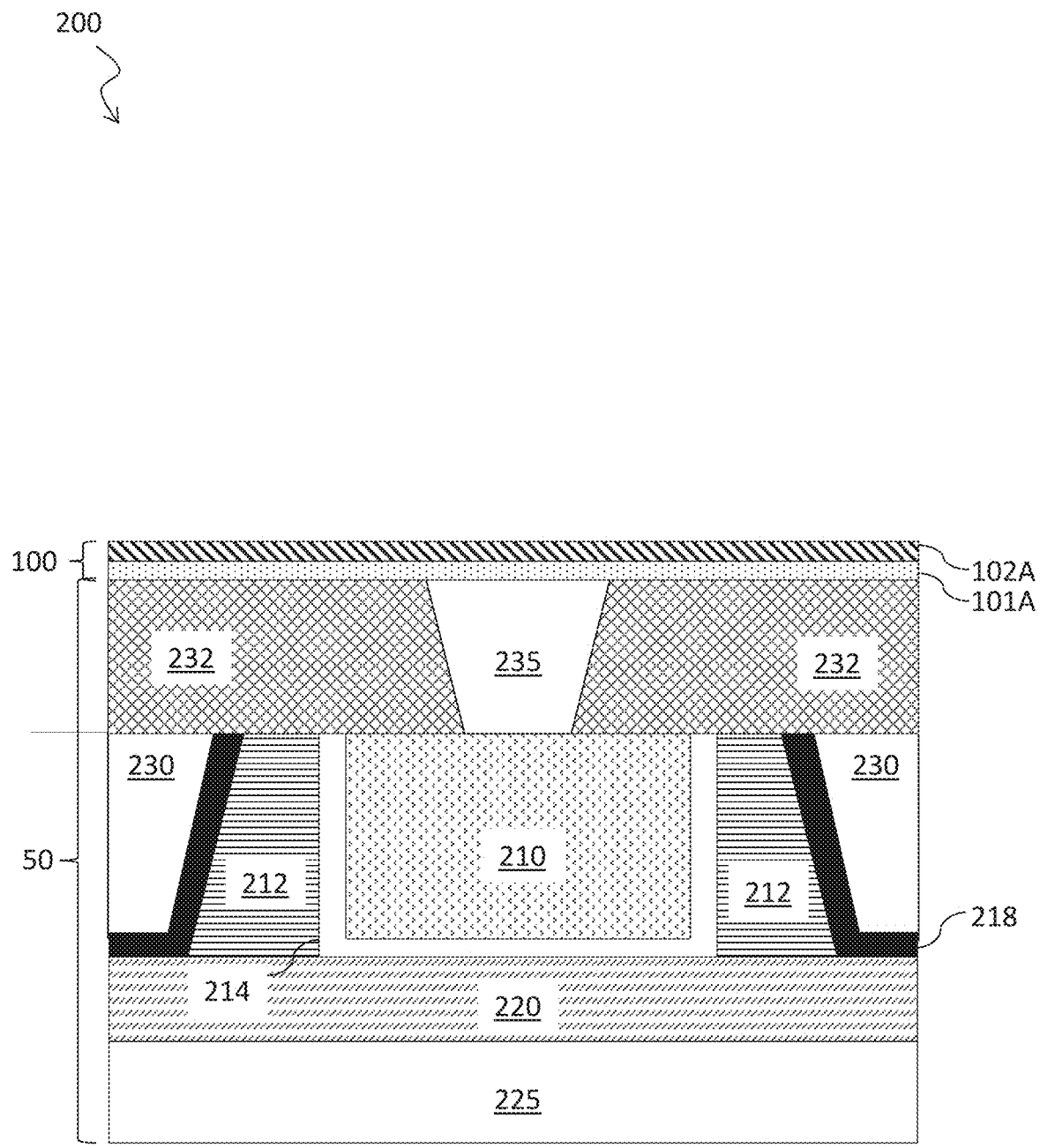
FIGS. 3 through 9 illustrate intermediate stages of manufacturing of a semiconductor structure, in accordance with some embodiments.
Figure 4:
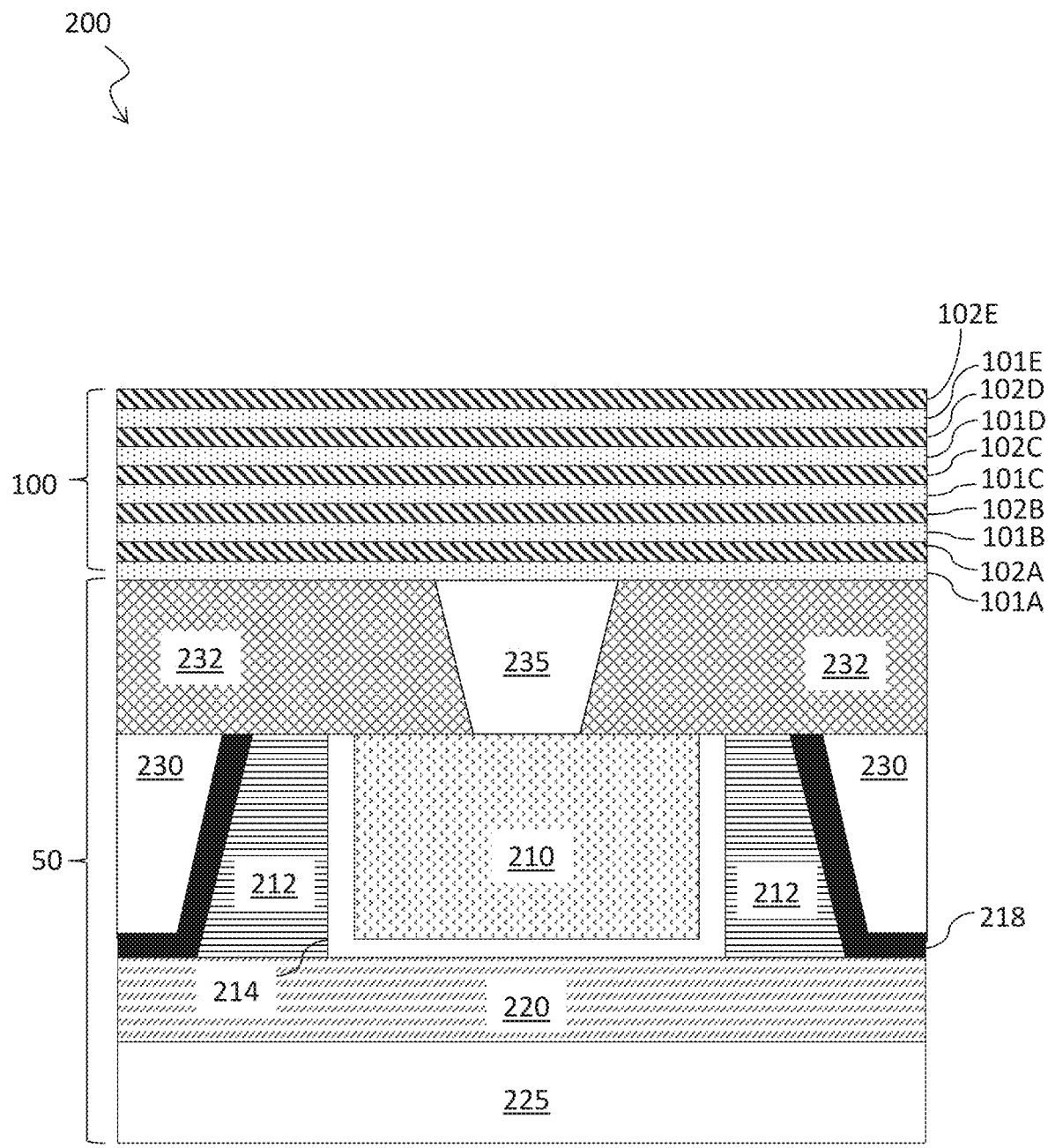
Figure 5:
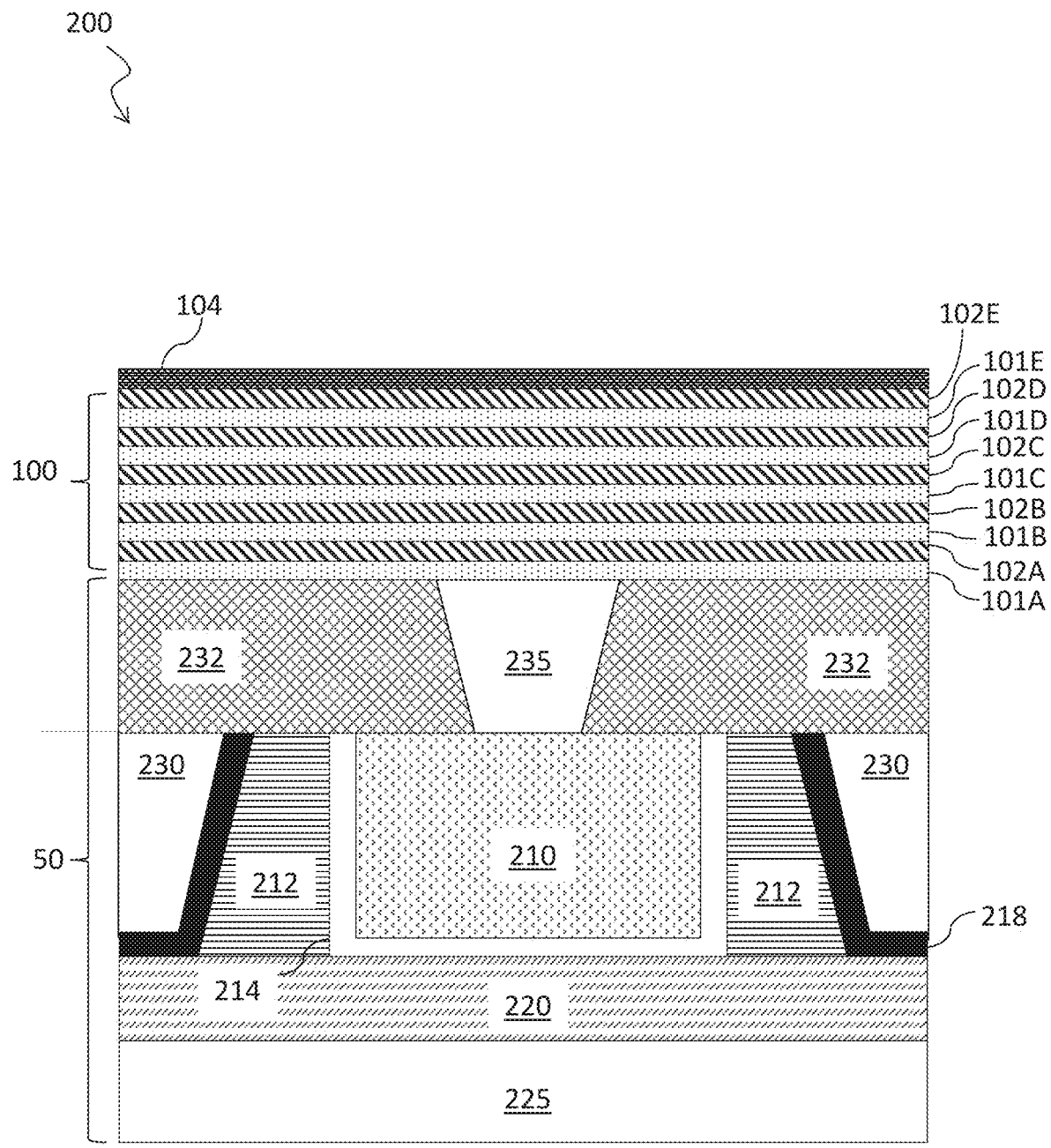

FIGS. 3 through 9 illustrate intermediate stages of manufacturing of a semiconductor structure 200 in a cross-sectional view, in accordance with some embodiments. FIGS. 3 through 5 illustrate the formation of a conductive superlattice structure 100 over a substrate 50. FIGS. 6 through 9 illustrate a subtractive patterning of the conductive superlattice structure 100 and a subsequent formation of an interconnect layer over the patterned conductive superlattice structure 100.

FIG. 3 illustrates the formation of a layer 101A of a first metal over an example substrate 50 and the formation of a layer 102A of ruthenium metal over the first layer 101A, in accordance with some embodiments. In various embodiments, the substrate 50 may be a part of, or include, a semiconductor device (e.g. one or more transistors), and may have undergone a number of steps of processing following, for example, a conventional process. The substrate 50 accordingly may comprise layers of semiconductors useful in various microelectronics. For example, the semiconductor structure 200 may comprise the substrate 50 in which various device regions are formed.

As illustrated in FIG. 3, the example substrate 50 includes a semiconductor substrate 225, a shallow trench isolation (STI) region 220, a metal gate 210, a high-k gate dielectric 214, a pair of source/drain spacers 212, a source/drain contact etch-stop layer (CESL) 218, a first interlayer dielectric (ILD) 230, a second ILD 232, and a contact 235.

In various embodiments, the semiconductor substrate 225 is a silicon wafer (e.g., a bulk crystalline silicon wafer), or a silicon-on-insulator (SOI) wafer. In certain embodiments, the semiconductor substrate 225 comprises silicon germanium, silicon carbide, gallium arsenide, gallium nitride, or other compound semiconductors. In other embodiments, the semiconductor substrate 225 comprises heterogeneous layers such as silicon germanium on silicon, gallium nitride on silicon, silicon carbon on silicon, as well layers of silicon on a silicon or SOI substrate. In various embodiments, the semiconductor substrate 225 is patterned or embedded in other components of the semiconductor device.

A gate structure of a transistor (e.g., a FinFET) is over the semiconductor substrate 225. The gate structure comprises a metal gate 210 (e.g., a multilayer metal stack comprising Ta, TaN, TiN, W, the like, or a combination thereof) and a gate dielectric 214 (e.g., a high-k gate dielectric comprising $HfO_2$, $Al_2O_3$, the like, or a combination thereof) inlaid within a recess formed earlier between a pair of source/drain spacers 212 (e.g., $SiO_xN_y$ spacers). As illustrated in FIG. 3, the metal gate 210 and the gate dielectric 214 are a portion of the metal gate structure and extend over a shallow trench isolation (STI) region 220 in recesses between semiconductor fins formed earlier, for example, by etching the semiconductor substrate 225. The semiconductor fins are not illustrated, being located along planes parallel to the plane of the cross-sectional view in FIG. 3. Source/drain regions (not illustrated) may be present in or on portions of the semiconductor fins adjacent to the gate structure.

The first ILD 230 is over the STI region 220 and the semiconductor substrate 225 and is adjacent to sidewalls of the source/drain spacers 212. The first ILD 230 comprises one or more insulators such as $SiO_2$ or a silicon oxide based low-k dielectric (e.g., porous oxides, fluorosilicate glass (FSG), and organosilicate glass (OSG)). In some embodiments, a source/drain contact etch-stop layer (CESL) 218 (e.g., a $Si_3N_4$ layer) lines the bottom surface of the first ILD 230.

A second ILD 232 is over the first ILD 230, the gate structure (including the metal gate 210 and the gate dielectric 214), and the source/drain spacers 212. The second ILD 232 may include similar materials as the first ILD 230 (see above). In some embodiments, the second ILD 232 includes a bottom layer that is an etch stop layer (ESL) that comprises a dielectric such as $Si_3N_4$, $SiO_xN_y$, SiC, or SiCN (not shown). A contact 235 extends through the second ILD 232 and physically and electrically couples with the metal gate 210. Additionally, in some embodiments, a conductive ESL (not shown) comprising, for example, TiN or TaN is formed over the second ILD 232 and the contact 235 before subsequent layers (e.g., the layers 101A and 102A) are deposited.

The substrate 50 is a non-limiting example and is described above for illustrative purposes. Any suitable substrate 50 with any suitable composition or arrangement of features may be used for the manufacturing of a semiconductor structure 200 that includes a conductive superlattice structure 100 formed on the substrate 50, and should be understood to be within the scope of the disclosed embodiments.

A layer 101A is formed from a first metal over the substrate 50. In some embodiments, the layer 101A is formed over the second ILD 232 and the contact 235 in the example illustrated by FIG. 3. In other embodiments, the second ILD 232 and the contact 235 are not present and the layer 101A is formed directly on the gate structure including the metal gate 210 and the gate dielectric 214. The layer 101A may be formed over any suitable substrate 50, and all such substrates are within the scope of the disclosed embodiments.

The composition of the first metal includes rhodium (Rh) metal, iridium (Ir) metal, palladium (Pd) metal, or the like, or a combination thereof. In another embodiment, the first metal includes a mixture of palladium (Pd) metal and copper (Cu) metal. Using a first metal including one or more metals from the group of rhodium (Rh) metal, iridium (Ir) metal, and palladium (Pd) metal may result in the layer 101A having a fcc structure and may further restrict formation of hcp structured ruthenium metal in a subsequent deposition of ruthenium (see below). The layer 101A may have a thickness less than 0.428 nm, such as about 0.4 nm, which is less than the center spacing of fcc structured ruthenium metal. For example, the layer 101A may be an atomic monolayer of the first metal. The layer 101A may be formed using physical vapor deposition in a process chamber 150 as described above with respect to FIG. 2. However, any suitable method may be used to form the layer 101A.

Next, a layer 102A of ruthenium metal is formed over the layer 101A of the first metal. The layer 102A may have a thickness less than 0.428 nm, which is less than the center spacing of fcc structured ruthenium metal. For example, the layer 102A may be an atomic monolayer of ruthenium metal. The lattice constant of the layer 102A of fcc structured ruthenium metal may be the range of 0.382 nm to 0.383 nm.

Forming the layer 102A of ruthenium metal over the layer 101A of the first metal, which includes one or more metals from the group of rhodium (Rh) metal, iridium (Ir) metal, and palladium (Pd), may restrict the formation of otherwise thermodynamically favored hcp structured ruthenium and result in the layer 102A having an fcc structure. This may lead to the conductive superlattice structure 100 having lower resistivity, due to the lower resistivity of fcc structured ruthenium in comparison with hcp structured ruthenium or fcc structured copper. Ruthenium with an fcc structure is a promising metal for narrow interconnects with high conductivity and low resistivity due to having a small product of its bulk resistivity ($\rho_o$) times its bulk electron free path ($\lambda$), $\rho_o \times \lambda$. For example, the $\rho_o \times \lambda$ of fcc structured ruthenium is $2.47 \times 10^{-16}$ $\Omega$-m$^2$, which is smaller than the $\rho_o \times \lambda$ of fcc structured ruthenium ($6.44 \times 10^{-16}$ $\Omega$-m$^2$ or $4.76 \times 10^{-16}$ $\Omega$-m$^2$) or the $\rho_o \times \lambda$ of fcc structured copper ($6.70 \times 10^{-16}$ $\Omega$-m$^2$). The layer 102A may be formed using physical vapor deposition in a process chamber 150 as described above with respect to FIG. 2. However, any suitable method may be used to form the layer 102A.

Next, in FIG. 4, additional alternating layers of a first metal 101B, 101C, 101D, and 101E with fcc crystal structure and layers of ruthenium metal 102B, 102C, 102D, and 102E with fcc crystal structure are formed. In some embodiments, each additional layer of the first metal or of ruthenium is formed with a physical vapor deposition process as described above with respect to FIG. 2.

In the example of FIG. 4, the conductive superlattice structure 100 includes five layers of the first metal and five layers of ruthenium metal. However, any suitable number of alternating layers of ruthenium metal and the first metal may be formed and are within the scope of the disclosed embodiments.

In FIG. 5, a capping layer 104 is formed over the conductive superlattice structure 100. The capping layer 104 may be or include a protection layer to protect the conductive superlattice structure 100 from oxidation or a chemical mechanical polish (CMP) stop layer for stopping a subsequent CMP (see below, FIG. 8). In some embodiments where the capping layer 104 is or includes a protection layer, the capping layer comprises titanium nitride (TiN) and is formed using PVD in the same process chamber 150 after forming the last layer of the conductive superlattice structure 100. In some embodiments where the capping layer 104 is or includes a CMP stop layer, the capping layer comprises silicon nitride (SiN) and is formed using PVD in the same process chamber 150 after forming the last layer of the conductive superlattice structure 100. However, any suitable process and materials may be used to form the capping layer 104. In some embodiments, the capping layer 104 is omitted.

Figure 6:
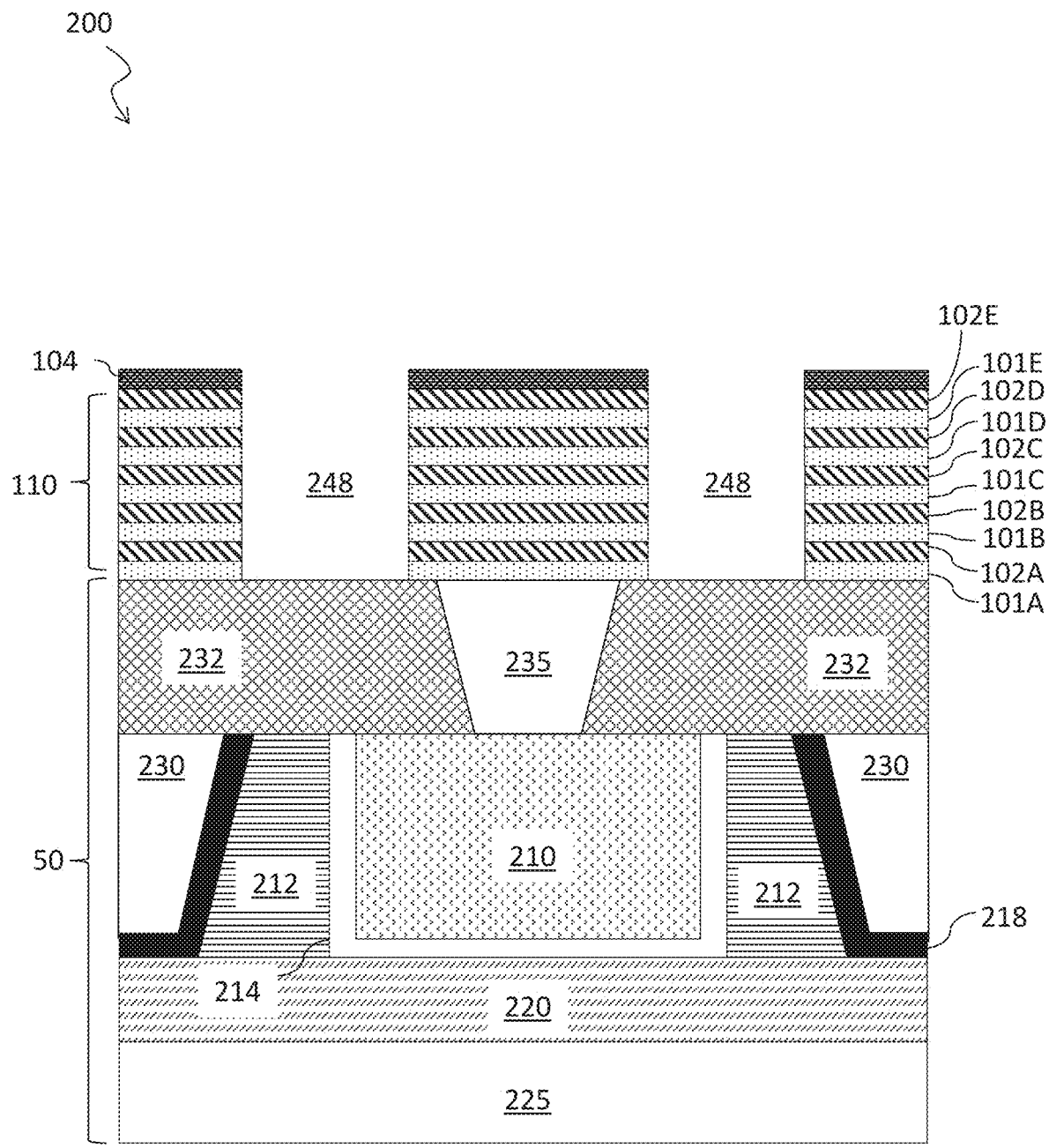

In FIG. 6, the conductive superlattice structure 100 is patterned to form conductive features 110, in accordance with some embodiments. The conductive features 110 (e.g., conductive lines) may form electrical connections in an interconnect structure, such as for back end of the line (BEOL) applications. In some embodiments, the conductive features 110 have widths (also referred to as critical dimensions) in a range of 5 nm to 15 nm, or less than 10 nm.

As an example of forming the conductive features 110, a patterned photoresist layer (not illustrated) is formed over the top surface of the conductive superlattice structure 100 using a photomask with a pattern designed for, e.g., conductive lines. Next, openings 248 are etched using the patterned photoresist layer as an etch mask. The etching may be performed using a suitable anisotropic etch technique, for example, a reactive ion etch (RIE) process using fluorine chemistry. However, any suitable etching process may be used. The etch may be chosen to be selective with the material underlying the conductive features 110, e.g. dielectric material the second ILD 232. In some embodiments, the conductive superlattice structure 100 is formed over another conductive material (e.g., a metal such as tungsten, cobalt, or copper, such as in the contact 235), and the etch process is selective with the conductive material underlying the conductive superlattice structure 100.

Figure 7:
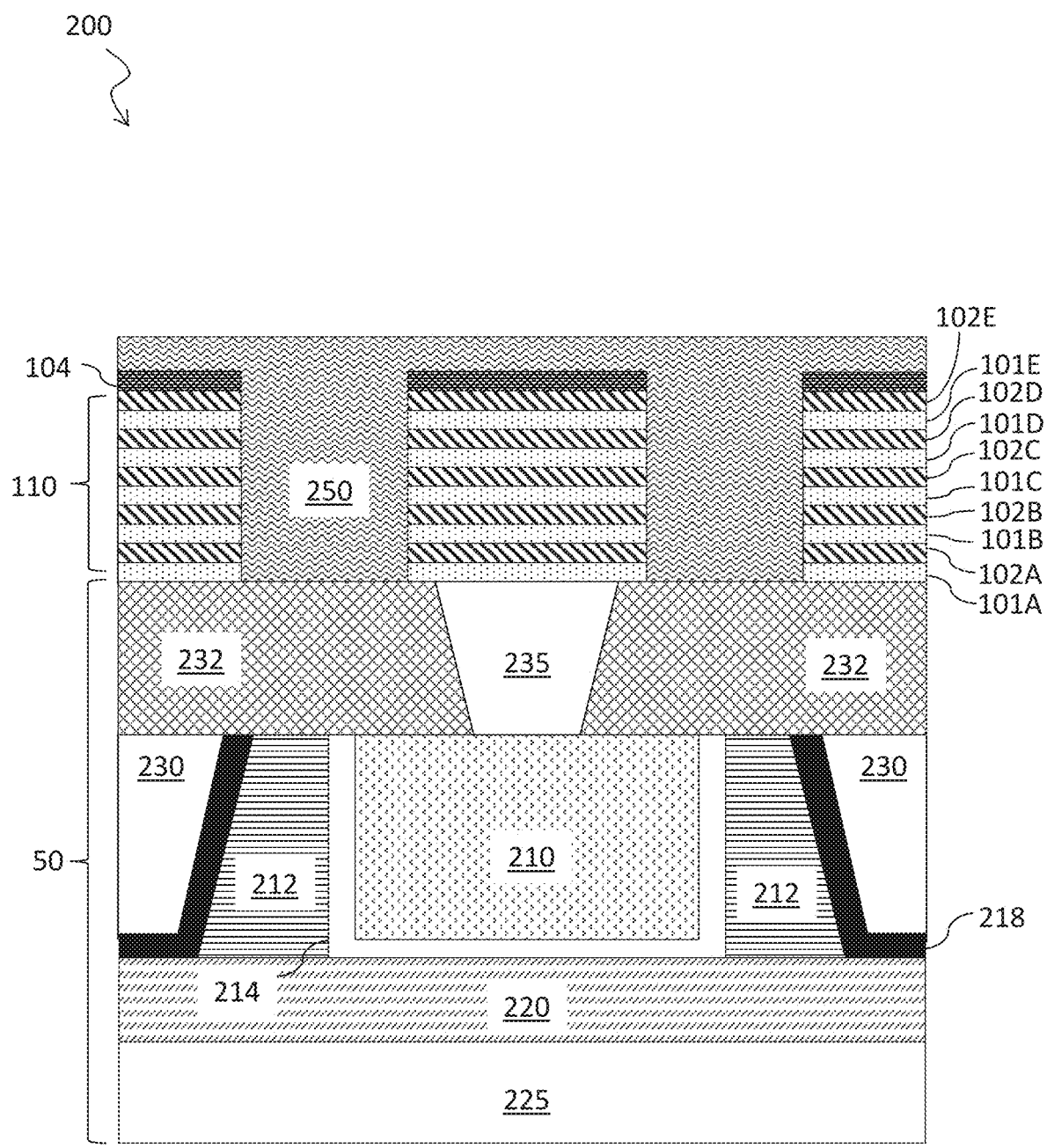

In FIG. 7, a first intermetal dielectric (IMD) 250 is formed over the conductive features 110 and fills the openings 248 (see above, FIG. 6), in accordance with some embodiments. The IMD 250 comprises an insulating material such as SiO$_2$ or a silicon oxide based low-k dielectric (e.g., porous oxides, fluorosilicate glass (FSG), and orthosilicate glass (OSG)), similar to the materials of the first ILD 230 and the second ILD 232 described above with respect to FIG. 3. The IMD 250 may be formed with a suitable process such as CVD or the like.

Figure 8:
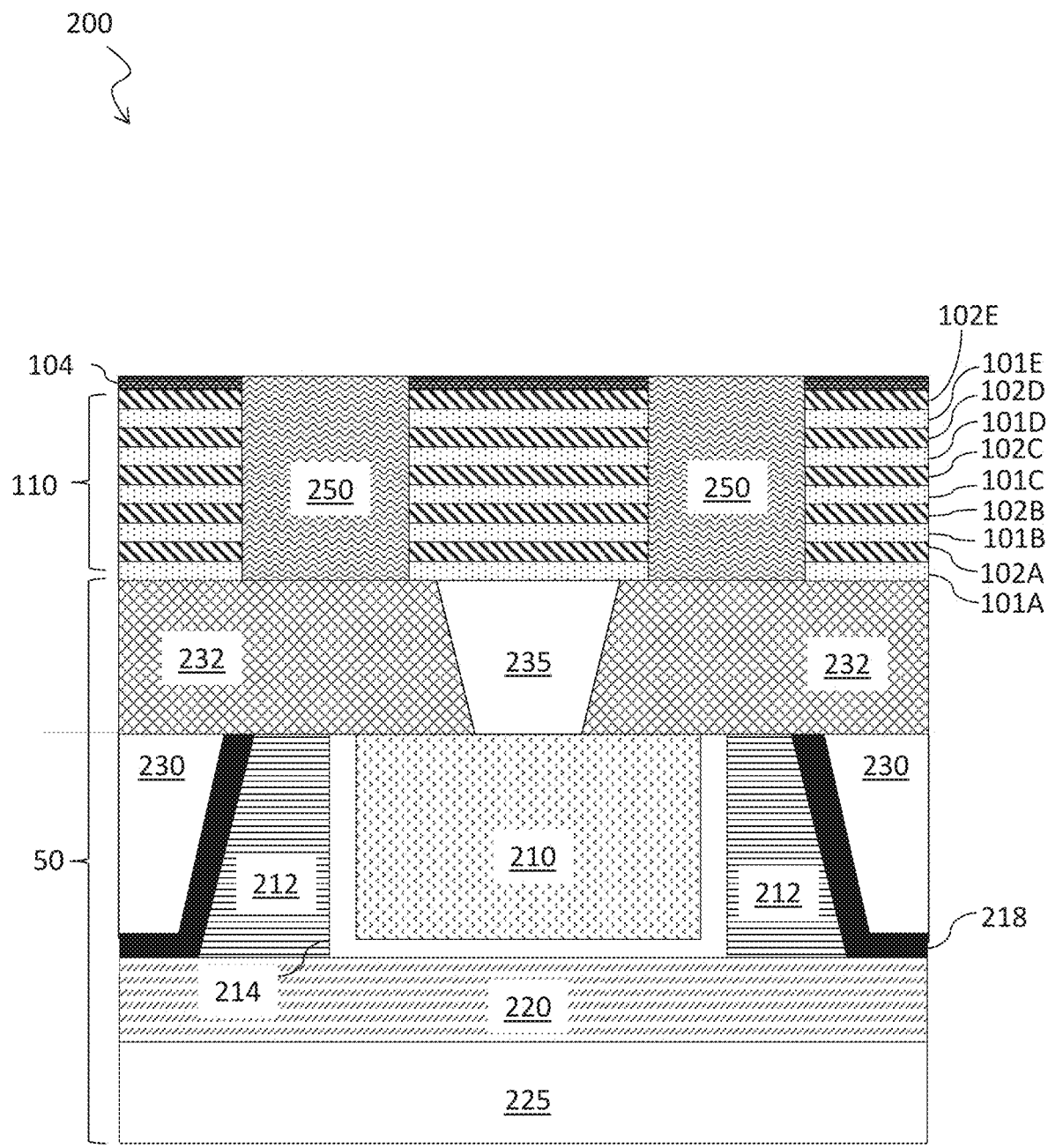

In FIG. 8, an excess portion of the IMD 250 is removed with a suitable etchback technique, for example, a chemical mechanical polish (CMP). In some embodiments, respective top portions of the capping layer 104 (if present) or respective top portions of the conductive features 110 are also removed.

Figure 9:
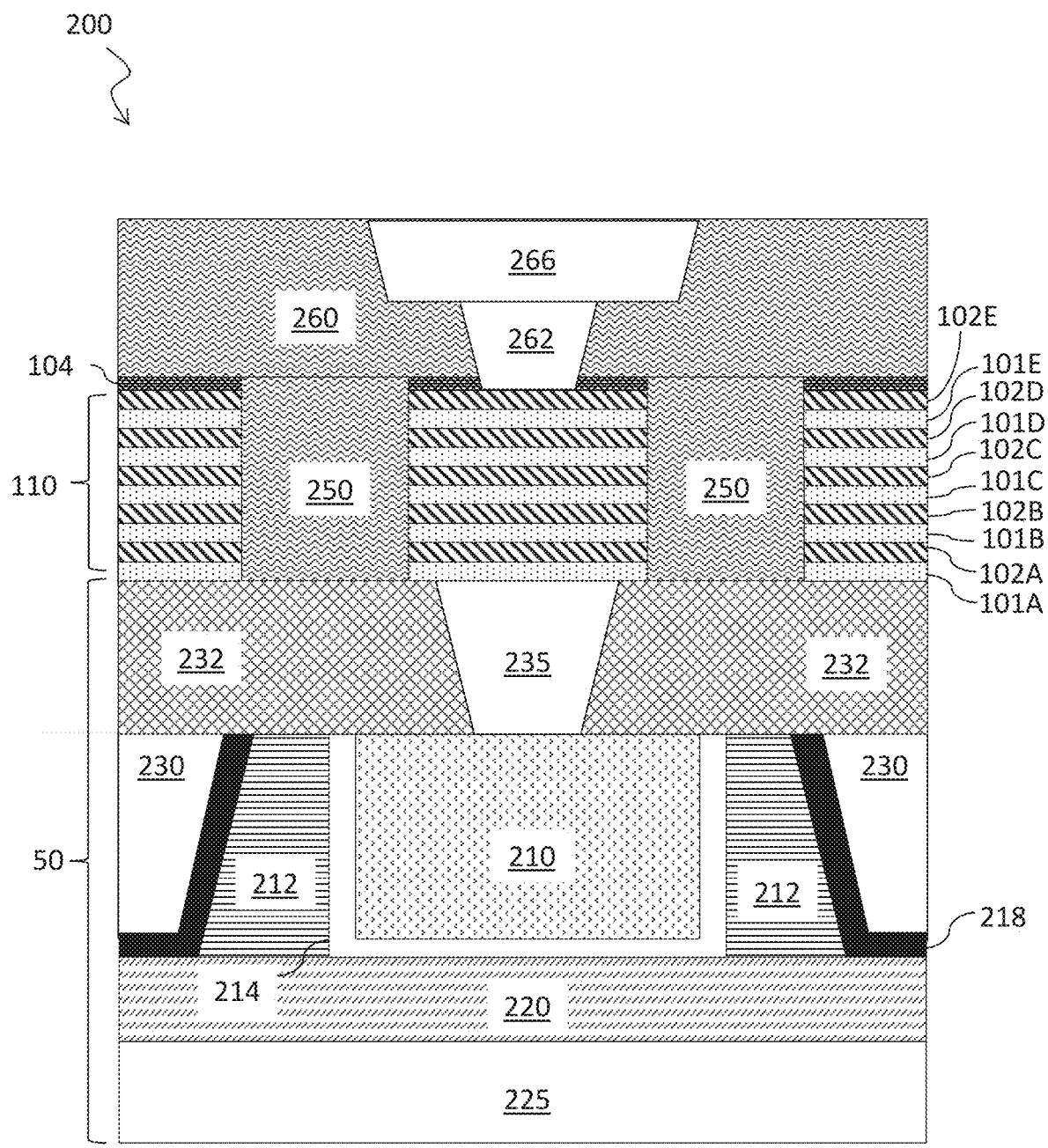

In FIG. 9, an interconnect layer is formed over the conductive features 110 and the IMD 250, in accordance with some embodiments. The interconnect layer includes an IMD 260 with a conductive via 262 and a conductive line 266 formed therein. The IMD 260 may be formed using similar methods and materials as described above for the IMD 250 with respect to FIG. 11. The conductive via 262 connects the conductive line 266 to a portion of the conductive feature 110 disposed directly below the conductive line 266. The conductive via 262 and the conductive line 266 may be formed with, for example, a conventional dual-damascene process using a conductive material such as copper or the like. As known by a person skilled in the art, the dual-damascene flow comprises patterning openings (e.g., holes for conductive vias 262 and trenches for conductive lines 266) in the IMD 260 using a via-first or a trench-first patterning sequence, depositing a conformal barrier metal (e.g., TiN or TaN) liner, filling the openings with metal (e.g., using Cu electroplating), and removing all excess conductive material from the top surface of the IMD 260 using a planarization process such as chemical mechanical planarization (CMP), thereby forming the conductive vias 262 and conductive lines 266 inlaid in the IMD 260.

The interconnect layer including the IMD 260 with the conductive via 262 and the conductive line 266 is included as a non-limiting example. Any suitable interconnect layer may be formed over the conductive features 110 and IMD 250 and is within the scope of the disclosed embodiments. For example, an additional conductive superlattice structure similar to the conductive superlattice structure 100 (see above, FIGS. 3-4) may be formed over the conductive features 110 and IMD 250 and subsequently patterned to form additional conductive features, with spaces between the conductive features subsequently filled by an IMD.

FIGS. 10 through 13 illustrate intermediate stages of manufacturing of another semiconductor structure 300 in a cross-sectional view, in accordance with some embodiments. The semiconductor structure 300 includes a conductive superlattice structure 400 that is formed and patterned with a semi-damascene process.

Figure 10:
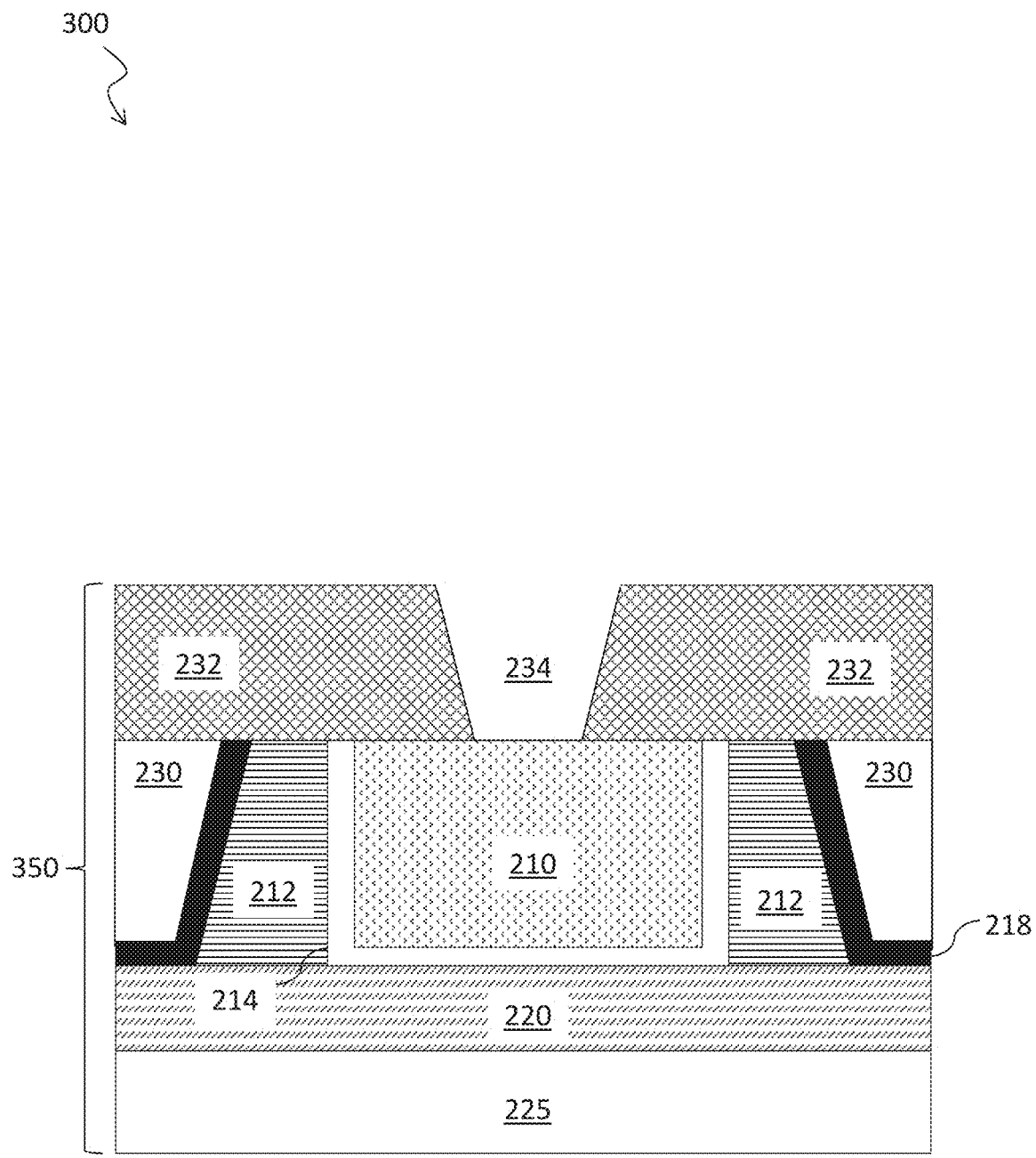
FIGS. 10 through 13 illustrate intermediate stages of manufacturing of a semiconductor structure, in accordance with some embodiments.

FIG. 10 illustrates a substrate 350 that is similar to the substrate 50 as described above with respect to FIG. 3 but without the contact 235 formed through the second ILD 232. An opening 234 is formed through the second ILD 232 to expose a top surface of the metal gate 210. The opening 234 may be formed with a suitable lithographic patterning process. In some embodiments, the opening 234 has tapered sidewalls and a trapezoidal profile in a cross-sectional view.

Figure 11:
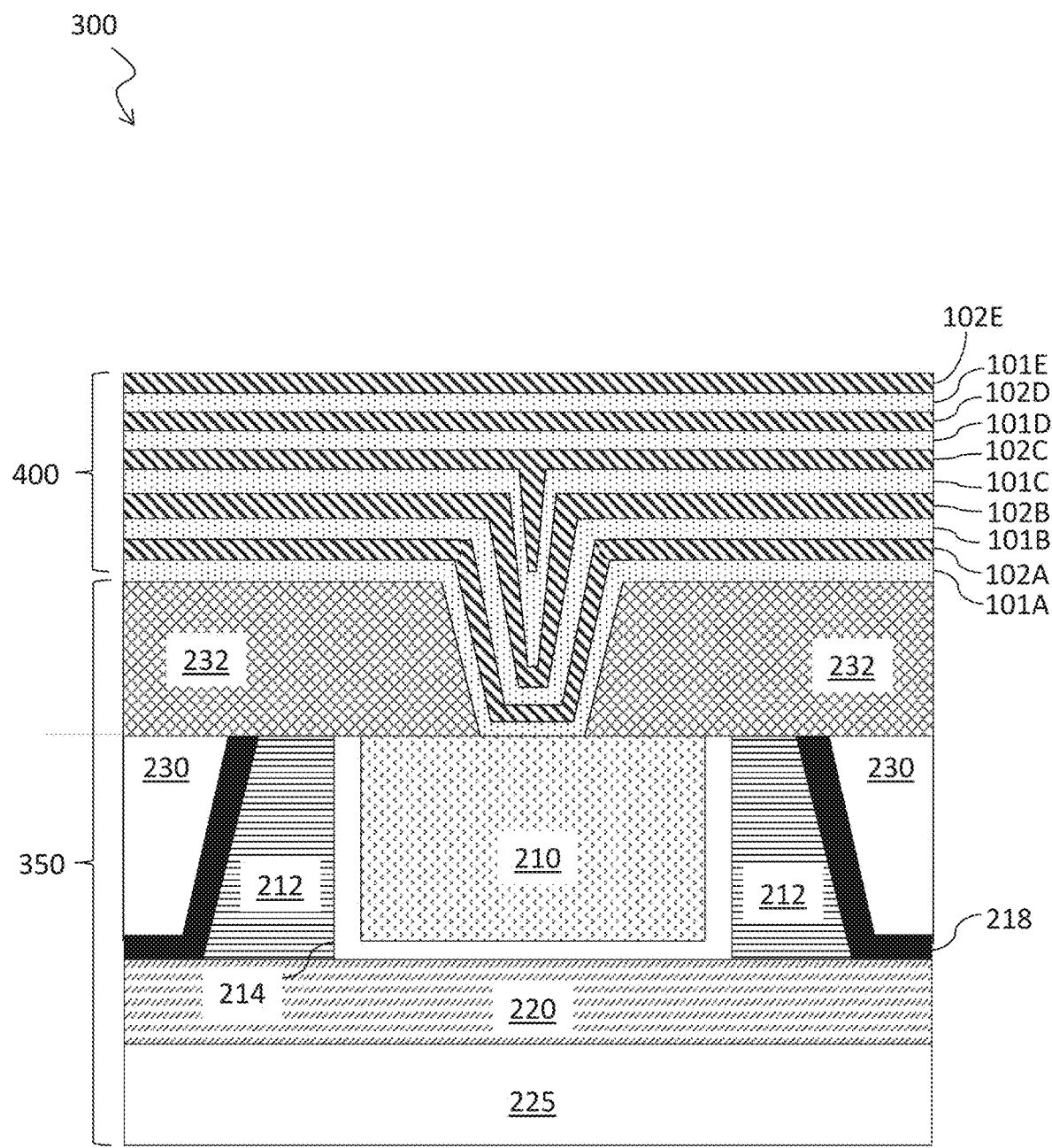

In FIG. 11, a conductive superlattice structure 400 is formed over the second ILD 232 and fills the opening 234 (see above, FIG. 10), physically contacting the top surface of the metal gate 210. The conductive superlattice structure 400 may be formed using similar methods and materials as the conductive superlattice structure 100 as described above with respect to FIGS. 3-4. As illustrated in FIG. 11, lower layers 101A, 101B, 102A, and 102B fill the opening 234.

However, any suitable number of layers of the conductive superlattice structure 400 may be deposited in and fill the opening 234.

Figure 12:
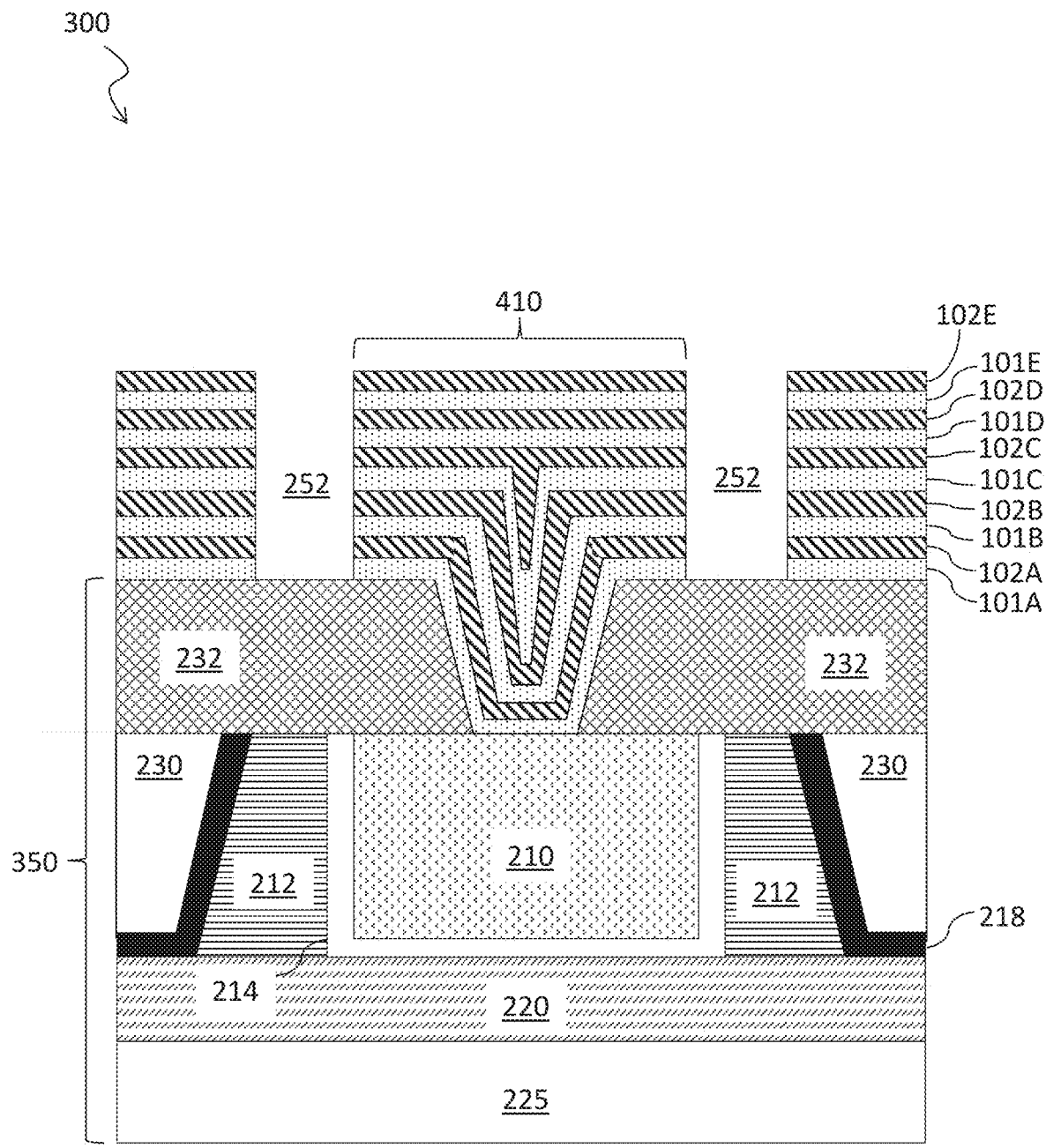

In FIG. 12, the conductive superlattice structure 400 is patterned to form conductive features 410 separated by air gaps 252. The conductive superlattice structure 400 may be patterned by a similar process as the conductive superlattice structure 100 as described above with respect to FIG. 6, and the details are not repeated herein. As illustrated in FIG. 12, a conductive feature 410 may include a lower via portion extending through the second ILD 232 to contact the metal gate 210 and an upper line portion above the second ILD 232. As such, the conductive features 410 are formed with a semi-damascene process.

Figure 13:
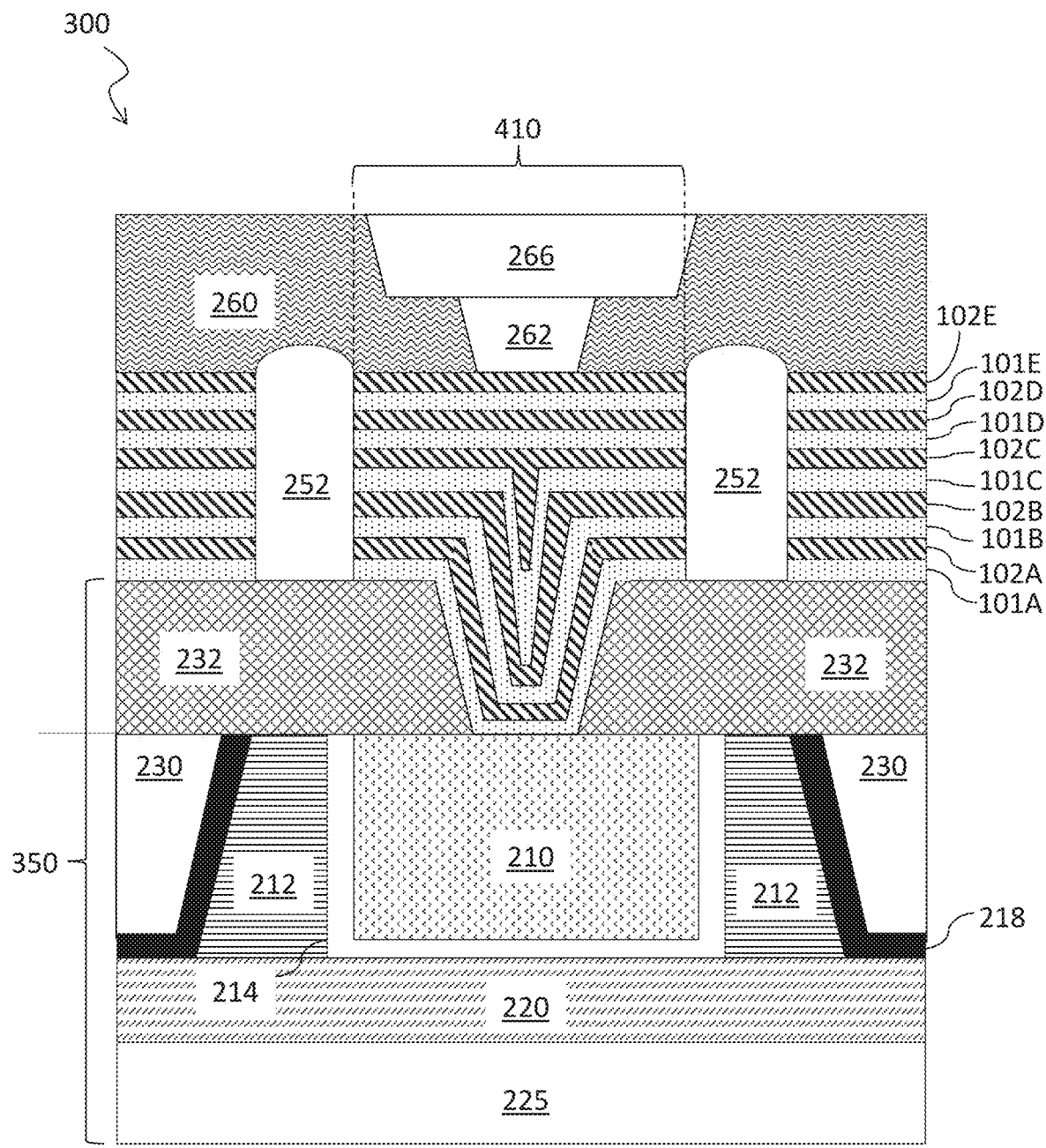

In FIG. 13, an interconnect layer is formed over the conductive features 410 and the air gaps 252, in accordance with some embodiments. The interconnect layer includes an IMD 260 with a conductive via 262 and a conductive line 266 formed therein. The conductive via 262 connects the conductive line 266 to a portion of the conductive feature 410 disposed directly below the conductive line 266. The IMD 260, conductive via 262, and conductive line 266 may be formed using similar methods and materials as described above with respect to FIG. 9, and the details are not repeated herein.

The air gaps 252 may be sealed by the IMD 260 and may contain air or other gases. The air gaps 252 being disposed between adjacent conductive features 410 that include alternating layers of ruthenium metal and first metal with fcc structure may reduce the resistance of the conductive features 410, thus increasing device performance.

Figure 14:
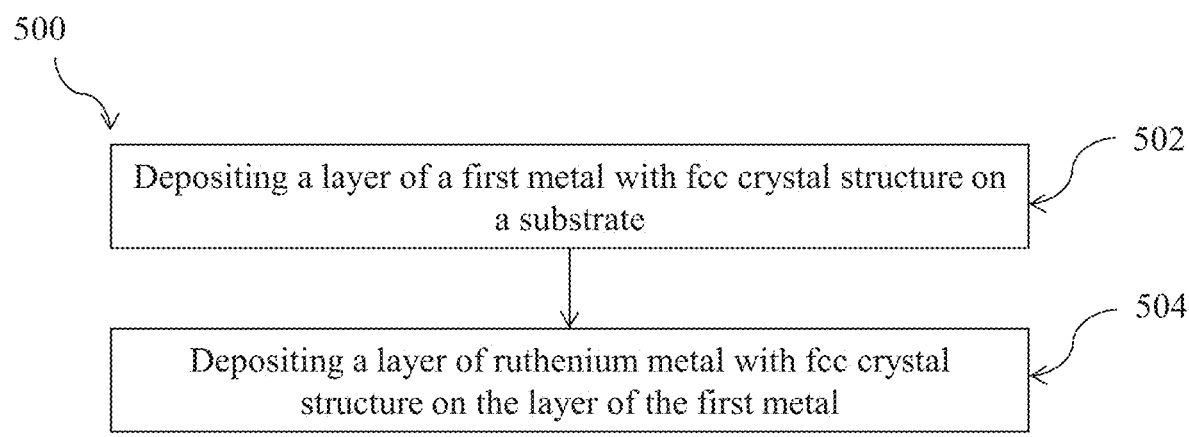
FIG. 14 is a flow chart of a method for a deposition process, in accordance with some embodiments.

FIG. 14 illustrates a flow chart diagram of a method 500 for a deposition process, in accordance with some embodiments. In step 502, a first layer 101A of a first metal with fcc crystal structure is deposited on a substrate 50, as described above with respect to FIGS. 2 and 3. In step 504, a first layer 102A of ruthenium metal with fcc crystal structure is deposited on the first layer 101A of the first metal, as described above with respect to FIGS. 2 and 3.

Figure 15:
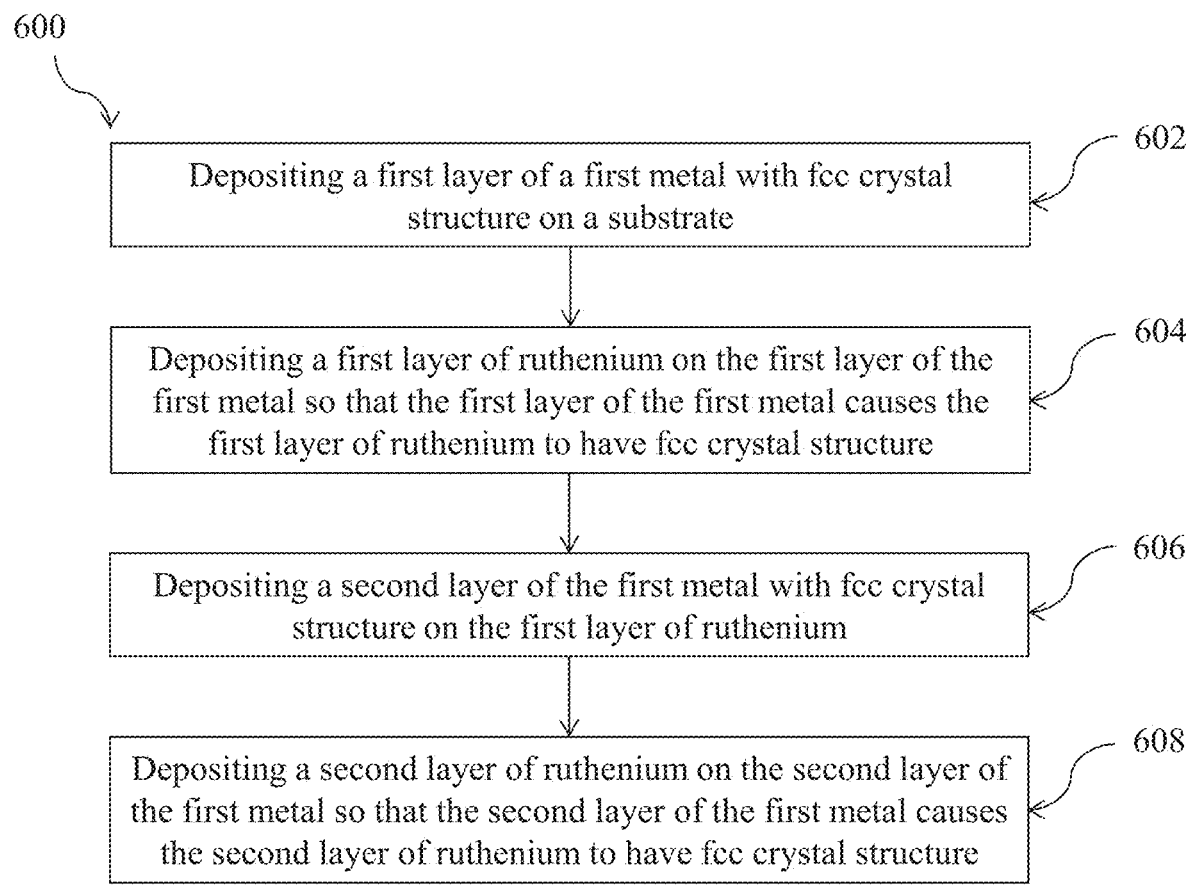
FIG. 15 is a flow chart of another method for a deposition process, in accordance with some embodiments.

FIG. 15 illustrates a flow chart diagram of a method 600 for a deposition process, in accordance with some embodiments. In step 602, a first layer 101A of a first metal with fcc crystal structure is deposited on a substrate 50, as described above with respect to FIGS. 2 and 3. In step 604, a first layer 102A of ruthenium metal is deposited on the first layer 101A of the first metal, so that the first layer 101A of the first metal causes the first layer 102A of ruthenium to have fcc crystal structure, as described above with respect to FIGS. 2 and 3. In step 606, a second layer 101B of the first metal with fcc crystal structure is deposited on the first layer 102A of ruthenium metal, as described above with respect to FIGS. 2 and 4. In step 608, a second layer 102B of ruthenium metal is deposited on the second layer 101B of the first metal, so that the second layer 101B of the first metal causes the second layer 102B of ruthenium to have fcc crystal structure, as described above with respect to FIGS. 2 and 4.

Example embodiments of the disclosure are summarized here. Other embodiments can also be understood from the entirety of the specification as well as the claims filed herein.

Example 1. A method of forming a metal superlattice structure, the method including: depositing, on a substrate, a layer of a first metal with face-centered-cubic (fcc) crystal structure; and depositing a layer of ruthenium (Ru) metal with fcc crystal structure on the layer of the first metal.

Example 2. The method of example 1, where the substrate includes a contact and a transistor, the contact being electrically coupled with the transistor, the metal superlattice structure being formed to electrically couple the metal superlattice structure to the transistor through the contact.

Example 3. The method of one of examples 1 or 2, further including: forming a conductive line by patterning the layer of the first metal and the layer of Ru metal; and forming an interconnect layer over the conductive line, where a conductive feature of the interconnect layer is coupled with the conductive line.

Example 4. The method of one of examples 1 to 3, where a surface of the layer of Ru metal is in direct physical contact with a surface of the layer of the first metal.

Example 5. The method of one of examples 1 to 4, where a thickness of the layer of Ru metal is less than or equal to the c lattice parameter of hexagonal-closed-packed (hcp) Ru metal crystal structure.

Example 6. The method of example 5, where the thickness of the layer of Ru metal restricts formation of the hcp Ru metal structure.

Example 7. The method of one of examples 1 to 6, where the layer of the first metal is selected from the group consisting of rhodium (Rh) metal, iridium (Ir) metal, and palladium (Pd) metal.

Example 8. The method of one of examples 1 to 7, where the metal superlattice structure has a lower electrical resistivity than a layer of hcp Ru metal with a same thickness as the metal superlattice structure.

Example 9. The method of one of examples 1 to 8, further including: depositing, on the layer of Ru metal, a second layer of the first metal with fcc crystal structure; and depositing a second layer of Ru metal with fcc crystal structure on the second layer of the first metal.

Example 10. The method of example 9, where the alternating layers of the first metal and the Ru metal form a periodic structure that has lower electrical resistivity than a layer of hcp Ru metal with a same thickness as the metal superlattice structure.

Example 11. A method of forming a metal superlattice structure, including: depositing, on a substrate including an active device, a first layer of a first metal with face-centered-cubic (fcc) crystal structure, the first layer being electrically coupled with the active device; depositing a first layer of ruthenium (Ru) metal on the first layer of the first metal, where the first layer of the first metal causes the first layer of Ru metal to have fcc crystal structure; depositing, on the first layer of Ru metal, a second layer of the first metal with fcc crystal structure; and depositing a second layer of Ru metal on the second layer of the first metal, where the second layer of the first metal causes the second layer of Ru metal to have fcc crystal structure.

Example 12. The method of example 11, further including: forming a first conductive feature by patterning the second layer of Ru metal, the second layer of the first metal, the first layer of Ru metal, and the first layer of the first metal; depositing an intermetal dielectric over the first conductive feature; and forming a second conductive feature in the intermetal dielectric, where the second conductive feature is coupled with the first conductive feature.

Example 13. The method of one of examples 11 or 12, where thicknesses of each of the first layer of Ru metal and the second layer of Ru metal are less than or equal to the c lattice parameter of hexagonal-closed-packed (hcp) Ru metal crystal structure.

Example 14. The method of one of examples 11 to 13, where the first layer of the first metal, the second layer of the first metal, the first layer of Ru metal, and the second layer of Ru metal are deposited by physical vapor deposition at a substrate temperature of less than 200 Kelvin.

Example 15. A metal superlattice structure, including: a layer of a first metal with face-centered-cubic (fcc) crystal structure; and a layer of ruthenium (Ru) metal with fcc crystal structure on the layer of the first metal.

Example 16. The structure of example 15, where a surface of the layer of Ru metal is in direct physical contact with a surface of the layer of the first metal.

Example 17. The structure of one of examples 15 or 16, where a thickness of the layer of Ru metal is less than or equal to the c lattice parameter of hexagonal-closed-packed (hcp) Ru metal crystal structure.

Example 18. The structure of one of examples 15 to 17, where a thickness of the layer of Ru metal restricts formation of an hcp Ru metal structure.

Example 19. The structure of one of examples 15 to 18, where the layer of the first metal is selected from the group consisting of rhodium (Rh) metal, iridium (Ir) metal, and palladium (Pd) metal.

Example 20. The structure of one of examples 15 to 18, where the layer of the first metal includes a mixture of palladium (Pd) metal and copper (Cu) metal.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method of forming a metal superlattice structure, the method comprising:
   depositing, on a substrate comprising an active device, a layer of a first metal with face-centered-cubic (fcc) crystal structure, the layer of the first metal being electrically coupled with the active device; and
   depositing a layer of ruthenium (Ru) metal with fcc crystal structure on the layer of the first metal.

2. The method of claim 1, wherein the substrate further comprises a contact and wherein the active device comprises a transistor, the contact being electrically coupled with the transistor, the metal superlattice structure being formed to electrically couple the metal superlattice structure to the transistor through the contact.

3. The method of claim 1, further comprising:
   forming a conductive line by patterning the layer of the first metal and the layer of Ru metal; and
   forming an interconnect layer over the conductive line, wherein a conductive feature of the interconnect layer is coupled with the conductive line.

4. The method of claim 1, wherein a surface of the layer of Ru metal is in direct physical contact with a surface of the layer of the first metal.

5. The method of claim 1, wherein a thickness of the layer of Ru metal is less than or equal to the c lattice parameter of hexagonal-closed-packed (hcp) Ru metal crystal structure.

6. The method of claim 5, wherein the thickness of the layer of Ru metal restricts formation of the hcp Ru metal crystal structure.

7. The method of claim 1, wherein the layer of the first metal is selected from the group consisting of rhodium (Rh) metal, iridium (Ir) metal, and palladium (Pd) metal.

8. The method of claim 1, wherein the metal superlattice structure has a lower electrical resistivity than a layer of hcp Ru metal with a same thickness as the metal superlattice structure.

9. The method of claim 1, further comprising:
depositing, on the layer of Ru metal, a second layer of the first metal with fcc crystal structure; and
depositing a second layer of Ru metal with fcc crystal structure on the second layer of the first metal.

10. The method of claim 9, wherein the alternating layers of the first metal and the Ru metal form a periodic structure that has lower electrical resistivity than a layer of hcp Ru metal with a same thickness as the metal superlattice structure.

11. A method of forming a metal superlattice structure, comprising:
depositing, on a substrate comprising an active device, a first layer of a first metal with face-centered-cubic (fcc) crystal structure, the first layer being electrically coupled with the active device;
depositing a first layer of ruthenium (Ru) metal on the first layer of the first metal, wherein the first layer of the first metal causes the first layer of Ru metal to have fcc crystal structure;
depositing, on the first layer of Ru metal, a second layer of the first metal with fcc crystal structure; and
depositing a second layer of Ru metal on the second layer of the first metal, wherein the second layer of the first metal causes the second layer of Ru metal to have fcc crystal structure.

12. The method of claim 11, further comprising:
forming a first conductive feature by patterning the second layer of Ru metal, the second layer of the first metal, the first layer of Ru metal, and the first layer of the first metal;
depositing an intermetal dielectric over the first conductive feature; and
forming a second conductive feature in the intermetal dielectric, wherein the second conductive feature is coupled with the first conductive feature.

13. The method of claim 11, wherein thicknesses of each of the first layer of Ru metal and the second layer of Ru metal are less than or equal to the c lattice parameter of hexagonal-closed-packed (hcp) Ru metal crystal structure.

14. The method of claim 11, wherein the first layer of the first metal, the second layer of the first metal, the first layer of Ru metal, and the second layer of Ru metal are deposited by physical vapor deposition at a substrate temperature of less than 200 Kelvin.

15. A metal superlattice structure, comprising:
a first layer of a first metal with face-centered-cubic (fcc) crystal structure;
a first layer of ruthenium (Ru) metal with fcc crystal structure on the first layer of the first metal;
a second layer of the first metal with face-centered-cubic (fcc) crystal structure on the first layer of the Ru metal; and
a second layer of Ru metal with fcc crystal structure on the second layer of the first metal.

16. The structure of claim 15, wherein a surface of the first layer of Ru metal is in direct physical contact with a surface of the first layer of the first metal.

17. The structure of claim 15, wherein a thickness of the first layer of Ru metal is less than or equal to the c lattice parameter of hexagonal-closed-packed (hcp) Ru metal crystal structure.

18. The structure of claim 15, wherein a thickness of the first layer of Ru metal restricts formation of an hcp Ru metal crystal structure.

19. The structure of claim 15, wherein the first metal is selected from the group consisting of rhodium (Rh) metal, iridium (Ir) metal, and palladium (Pd) metal.

20. The structure of claim 15, wherein the first layer of the first metal includes a mixture of palladium (Pd) metal and copper (Cu) metal.

* * * * *